United States Patent
Bae et al.

(10) Patent No.: US 10,910,299 B2
(45) Date of Patent: Feb. 2, 2021

(54) METHOD OF MANUFACTURING SEMICONDUCTOR PACKAGE SUBSTRATE AND SEMICONDUCTOR PACKAGE SUBSTRATE MANUFACTURED USING THE METHOD, AND METHOD OF MANUFACTURING SEMICONDUCTOR PACKAGE AND SEMICONDUCTOR PACKAGE MANUFACTURED USING THE METHOD

(71) Applicant: HAESUNG DS CO., LTD., Changwon-si (KR)

(72) Inventors: In Seob Bae, Changwon-si (KR); Sung Il Kang, Gimhae-si (KR); Dong Jin Yoon, Changwon-si (KR)

(73) Assignee: HAESUNG DS CO., LTD., Changwon-si (KR)

( * ) Notice: Subject to any disclaimer, the term of this patent is extended or adjusted under 35 U.S.C. 154(b) by 0 days.

(21) Appl. No.: 16/145,026

(22) Filed: Sep. 27, 2018

(65) Prior Publication Data

US 2019/0267315 A1    Aug. 29, 2019

(30) Foreign Application Priority Data

Feb. 23, 2018   (KR) .......................... 10-2018-0022231

(51) Int. Cl.
*H01L 21/76* (2006.01)
*H01L 23/498* (2006.01)
(Continued)

(52) U.S. Cl.
CPC .. *H01L 23/49827* (2013.01); *H01L 21/76224* (2013.01); *H01L 21/76802* (2013.01);
(Continued)

(58) Field of Classification Search
CPC ................... H01L 21/76224; H01L 21/76802
See application file for complete search history.

(56) References Cited

U.S. PATENT DOCUMENTS

| 8,535,987 B2 | 9/2013 | Maniwa et al. |
| 2007/0145551 A1* | 6/2007 | Yamaji ................ H01L 21/6835 257/678 |

(Continued)

FOREIGN PATENT DOCUMENTS

| JP | 2000294715 A | 10/2000 |
| JP | 2002280488 A | 9/2002 |

(Continued)

OTHER PUBLICATIONS

Korean Intellectual Property Office, Office Action in Korean Patent Application No. 10-2018-0022231, dated Apr. 17, 2019, 5 pages.

*Primary Examiner* — Trang Q Tran
(74) *Attorney, Agent, or Firm* — Schwabe, Williamson & Wyatt, P.C.

(57) ABSTRACT

Provided are a method of manufacturing a semiconductor package substrate, a semiconductor package substrate manufactured using the method of manufacturing a semiconductor package substrate, a method of manufacturing a semiconductor package, and a semiconductor package manufactured using the method of manufacturing a semiconductor package. The method of manufacturing a semiconductor package substrate includes forming first grooves or first trenches in a bottom surface of a base substrate having a top surface and the bottom surface and formed of a conductive material; filling the first grooves or trenches with resin; curing the resin; removing exposed portions of the resin overfilled in the first grooves or trenches; etching the top surface of the base substrate to expose at least portions of the resin filled in the first grooves or trenches;

(Continued)

and forming a second groove or a second trench in the bottom surface of the base substrate.

18 Claims, 3 Drawing Sheets

(51) Int. Cl.
 *H01L 23/532* (2006.01)
 *H01L 21/762* (2006.01)
 *H01L 21/768* (2006.01)

(52) U.S. Cl.
 CPC .. *H01L 21/76879* (2013.01); *H01L 23/49838* (2013.01); *H01L 23/53233* (2013.01); *H01L 23/53261* (2013.01)

(56) References Cited

U.S. PATENT DOCUMENTS

| | | | |
|---|---|---|---|
| 2012/0223622 A1* | 9/2012 | Otsuki | H03H 9/02 |
| | | | 310/344 |
| 2014/0203418 A1* | 7/2014 | Xing | H01L 21/4828 |
| | | | 257/666 |
| 2015/0076675 A1* | 3/2015 | Real | H01L 23/49548 |
| | | | 257/676 |
| 2019/0057930 A1 | 2/2019 | Bae et al. | |
| 2019/0122968 A1 | 4/2019 | Bae et al. | |

FOREIGN PATENT DOCUMENTS

| | | |
|---|---|---|
| JP | 2008112961 A | 5/2008 |
| JP | 2010238694 A | 10/2010 |
| JP | 2014207481 A | 10/2014 |
| JP | 2017168691 A | 9/2017 |
| KR | 10-1747226 B1 | 6/2017 |
| TW | 201803035 A | 1/2018 |

\* cited by examiner

METHOD OF MANUFACTURING SEMICONDUCTOR PACKAGE SUBSTRATE AND SEMICONDUCTOR PACKAGE SUBSTRATE MANUFACTURED USING THE METHOD, AND METHOD OF MANUFACTURING SEMICONDUCTOR PACKAGE AND SEMICONDUCTOR PACKAGE MANUFACTURED USING THE METHOD

CROSS-REFERENCE TO RELATED APPLICATION

This application claims the benefit of Korean Patent Application No. 10-2018-0022231, filed on Feb. 23, 2018, in the Korean Intellectual Property Office, the disclosure of which is incorporated herein in its entirety by reference.

BACKGROUND

1. Field

One or more embodiments relate to a method of manufacturing a semiconductor package substrate on which soldering is performed in an easy manner and a semiconductor package substrate manufactured using the same, and a method of manufacturing a semiconductor package and a semiconductor package manufactured using the same.

2. Description of the Related Art

A semiconductor device is used by being packaged on a semiconductor package substrate. To package the semiconductor device, the semiconductor package substrate includes a fine circuit pattern and/or input/output (I/O) terminals. As the performance and/or integration degrees of semiconductor devices have been improved and electronic devices using such semiconductor device have been manufactured to have a decreased size and improved performance, critical dimensions of fine circuit patterns, etc. of semiconductor package substrates have become smaller and the complexity thereof has become higher.

Existing semiconductor package substrates are manufactured by forming through-holes by using a copper clad laminate (CCL) having stacked thereon a copper foil, plating insides of the through-holes with a metal to electrically connect the copper foils stacked on top and bottom surfaces of the CCL, and patterning the upper-surface copper foil and the lower-surface copper foil by using a photoresist. However, the method of manufacturing existing semiconductor package substrates is disadvantageous in terms of high process complexity and low precision.

Accordingly, recently, a method of manufacturing a semiconductor package substrate by filling a conductive base substrate with an insulating material to simplify a manufacturing process has been introduced.

SUMMARY

One or more embodiments are directed to a method of manufacturing a semiconductor package substrate on which soldering is performed in an easy manner and a semiconductor package substrate manufactured using the method, and a method of manufacturing a semiconductor package and a semiconductor package manufactured using the method. However, these aspects are merely examples and thus the scope of the disclosure should not be construed as being limited thereby.

Additional aspects will be set forth in part in the description which follows and, in part, will be apparent from the description, or may be learned by practice of the presented embodiments.

According to one or more embodiments, a method of manufacturing a semiconductor package substrate includes forming first grooves or first trenches in a bottom surface of a base substrate, the base substrate having a top surface and the bottom surface and formed of a conductive material; filling the first grooves or trenches with resin; curing the resin; removing exposed portions of the resin overfilled in the first grooves or trenches; etching the top surface of the base substrate to expose at least portions of the resin filled in the first grooves or trenches; and forming a second groove or a second trench in the bottom surface of the base substrate.

In one embodiment, the etching of the top surface of the base substrate and the forming of the second groove or trench may be simultaneously performed.

In one embodiment, the forming of the second groove or trench may include forming the second groove or trench along a cut line.

In one embodiment, the forming of the second groove or trench may include forming the second groove or trench between adjacent first grooves or trenches filled with the resin.

In one embodiment, before the filling of the first grooves or trenches with the resin, the method may further include roughening inner surfaces of the first grooves or trenches.

In one embodiment, an area of the resin exposed on the bottom surface of the base substrate via the first grooves or trenches may be greater than that of the resin exposed on the top surface of the base substrate via the second groove or trench.

In one embodiment, the method may further include forming a plating layer on the base substrate.

In one embodiment, the forming of the plating layer may include forming the plating layer on an inner surface of the second groove or trench.

According to one or more embodiments, a semiconductor package substrate manufactured by the method described above is provided.

According to one or more embodiments, a method of manufacturing a semiconductor package includes forming first grooves or first trenches in a bottom surface of a base substrate, the base substrate having a top surface and the bottom surface and formed of a conductive material; filling the first grooves or trenches with resin; curing the resin; removing exposed portions of the resin overfilled in the first grooves or trenches; etching the top surface of the base substrate to expose at least portions of the resin filled in the first grooves or trenches; forming a second groove or a second trench in the bottom surface of the base substrate; mounting a semiconductor chip on the base substrate; and cutting the base substrate along the second groove or trench.

In one embodiment, the etching of the top surface of the base substrate and the forming of the second groove of trench may be simultaneously performed.

In one embodiment, the forming of the second groove or trench may include forming the second groove or trench between adjacent first grooves or trenches filled with the resin.

In one embodiment, in the cutting of the base substrate, a width of a cut line for cutting the base substrate may be less than that of the second groove or trench.

In one embodiment, the method may further include forming a plating layer on the base substrate.

According to one or more embodiments, a semiconductor package manufactured by the method described above is provided.

These and other aspects, features, and effects will be apparent from the accompanying drawings, the claims, and the following description.

General and specific aspects as set forth herein may be implemented using systems, methods, computer programs, or a combination thereof.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
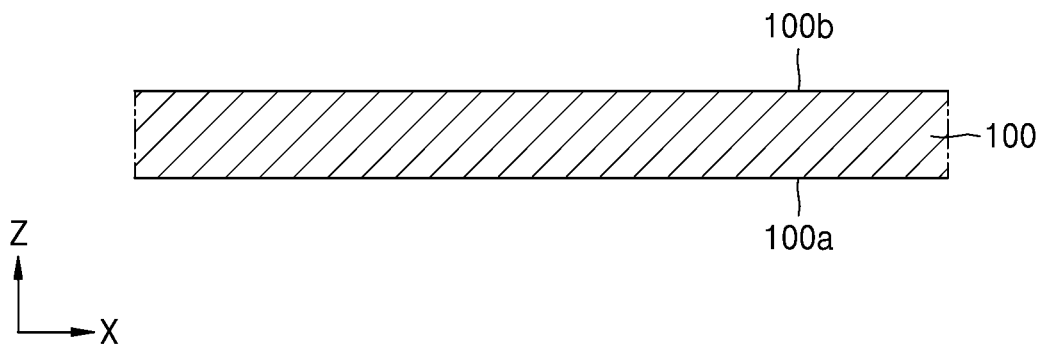
FIGS. 1 to 6 are schematic cross-sectional views illustrating a process of manufacturing a semiconductor package substrate according to an embodiment.

Various modifications may be made in the disclosure and various embodiments may be implemented. Thus, example embodiments are illustrated in the drawings and described in detail herein. Advantages features of the disclosure and methods of achieving them will be apparent from embodiments to be described in detail below in conjunction with the drawings. However, the disclosure is not limited thereto and may be embodied in many different forms. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments will be described in detail with reference to the accompanying drawings. When describing the embodiments with reference to the drawings, the same or corresponding components are assigned the same reference numerals and are not redundantly described herein.

In the following embodiments, the terms "first", "second", etc. are not used to restrict the scope of the disclosure and are only used to distinguish one component from another component. As used herein, the singular forms "a", "an" and "the" are intended to include the plural forms as well, unless the context clearly indicates otherwise.

It will be understood that the terms "comprises" and/or "comprising," when used herein, specify the presence of stated features or components, but do not preclude the presence or addition of one or more other features or components. It will be understood that when an element such as a layer, a region, or a component is referred to as being "on" or "above" another element, the element can be directly on another element or another element may be interposed therebetween.

In the drawings, the sizes of components may be exaggerated for convenience of explanation. For example, the size and thickness of each component illustrated in the drawings are arbitrarily illustrated for convenience of explanation and thus embodiments should not be construed as being limited thereto.

As used herein, an x-axis, a y-axis, and a z-axis are not limited to the three axes of an orthogonal coordinate system and may be broadly understood as being any three axes. For example, the x-axis, the y-axis, and the z-axis may be perpendicular to one another but may indicate non-orthogonal different directions.

When an embodiment can be implemented differently, a certain process may be performed in an order different from that described here. For example, two processes described consecutively may be performed substantially simultaneously or performed in an order opposite to that described herein.

FIGS. 1 to 6 are schematic cross-sectional views illustrating a process of manufacturing a semiconductor package substrate according to an embodiment.

In a method of manufacturing a semiconductor package substrate 10 according to the present embodiment, first, a base substrate 100 formed of a conductive material is prepared as illustrated in FIG. 1. The base substrate 100 may be in a flat plate form including an electro-conductive material. Examples of the electro-conductive material may include iron (Fe), an Fe alloy such as Fe—Ni or Fe—Ni—Co, copper (Cu), a Cu alloy such as Cu—Sn, Cu—Zr, Cu—Fe, or Cu—Zn, and so on. The base substrate 100 may have a plate shape, including a top surface 100b and a bottom surface 100a, which are opposite surfaces.

Figure 2:
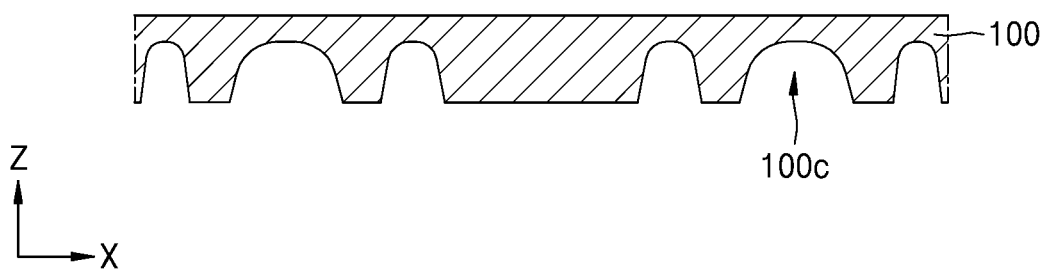

Thereafter, as illustrated in FIG. 2, first grooves or trenches 100c are formed in the bottom surface 100a of the base substrate 100. Here, the first grooves or trenches 100c may be understood as incompletely passing through the base substrate 100. Although not shown in FIG. 2 which is a cross-sectional view, remaining portions of the base substrate 100 except the first grooves or trenches 100c formed in the bottom surface 100a may be understood as an interconnection pattern extending in one direction or a winding interconnection pattern, when viewed from a plan view.

To form the first grooves or trenches 100c, the bottom surface 100a of the base substrate 100 is laminated with a photosensitive dry film resist (DFR) and then is exposed and developed to expose only portions of the base substrate 100 in which the first grooves or trenches 100c are to be formed. Next, the portions of the bottom surface 100a of the base substrate 100 which are not covered with the DFR are etched with an etching solution, such as copper chloride or iron chloride, to form the first grooves or trenches 100c in the bottom surface 100a not to pass through the base substrate 100 as illustrated in FIG. 2.

The remaining portions of the bottom surface 100a of the base substrate 100, i.e., the portions thereof except the first grooves or trenches 100c, may function as an interconnection pattern at a later time. Accordingly, when the first grooves or trenches 100c are formed in the bottom surface 100a of the base substrate 100, a width of a space between adjacent first grooves or trenches 100c may be equal to a width of a general interconnection pattern, i.e., about 20 μm to 30 μm.

When the first grooves or trenches 100 are formed in the bottom surface 100a of the base substrate 100 as illustrated in FIG. 2, a depth of the first grooves or trenches 100c may be about 80% to 90% of a thickness of the base substrate 100. For example, a thickness of the remaining portions of the base substrate 100 in which the first grooves or trenches 100c are formed may be in a range of about 10 µm to about 40 µm.

When the depth of the first grooves or trenches 100c is greater than about 80% to 90% of the thickness of the base substrate 100, the base substrate 100 or the semiconductor package substrate 10 may not be easy to handle in a semiconductor package substrate manufacturing process or a later packaging process. In some cases, when the depth of the first grooves or trenches 100c is greater than about 80% to 90% of the thickness of the base substrate 100, through-holes passing through the bottom surface 100a and the top surface 100b of the base substrate 100 may be formed due to a tolerance during the forming of the first grooves or trenches 100c. When the depth of the first grooves or trenches 100c is less than about 80% to 90% of the thickness of the base substrate 100, a subsequent process may not be easy to perform when a semiconductor package substrate is manufactured at a later time or a finally manufactured semiconductor substrate may be excessively thin.

Figure 3:
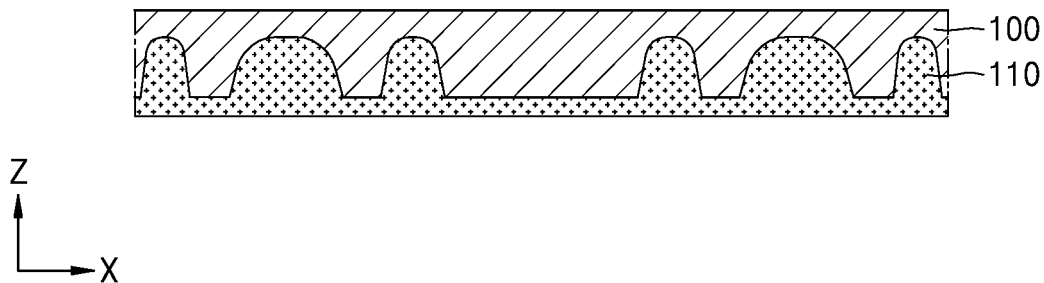

Thereafter, as illustrated in FIG. 3, the first grooves or trenches 100c of the base substrate 100 are filled with resin 110. The resin 110 may be any type of insulating material having non-electrical properties. For example, the resin 110 may be thermosetting resin polymerized and cured when heated. The resin 110 electrically insulates between interconnection patterns of the semiconductor package substrate 10. In the filling of the resin 110, the resin 110 which is in a liquid state or a solid type tape containing the resin 110 may be used.

In the filling of the resin 110, not only the first grooves or trenches 100c of the base substrate 100 but also at least portions of the bottom surface 100a of the base substrate 100 may be filled with the resin 110 as illustrated in FIG. 3. When the resin 110 is overfilled as described above, the overfilled resin 110 may be removed by mechanical machining, such as brushing, grinding or polishing, or chemical machining such as etching to fill only the insides of the first grooves or trenches 100c of the base substrate 100 with the resin 110 as illustrated in FIG. 4.

Figure 4:
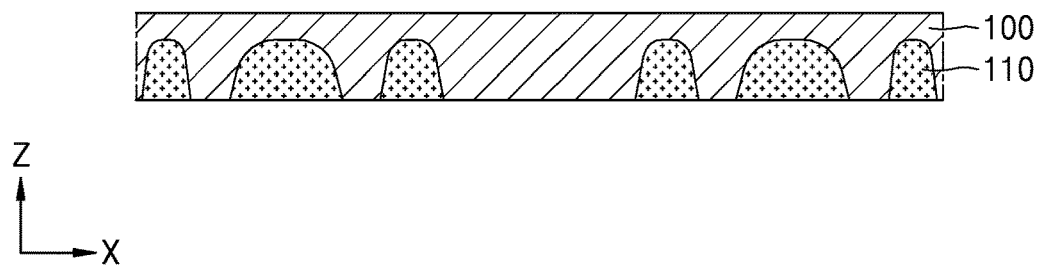

Alternatively, only the first grooves or trenches 100c of the base substrate 100 may be filled with the resin 110 as illustrated in FIG. 4 rather than overfilling the resin 110 as illustrated in FIG. 3. However, in this case, the first grooves or trenches 100c of the base substrate 100 may not be appropriately filled with the resin 110.

Figure 5:
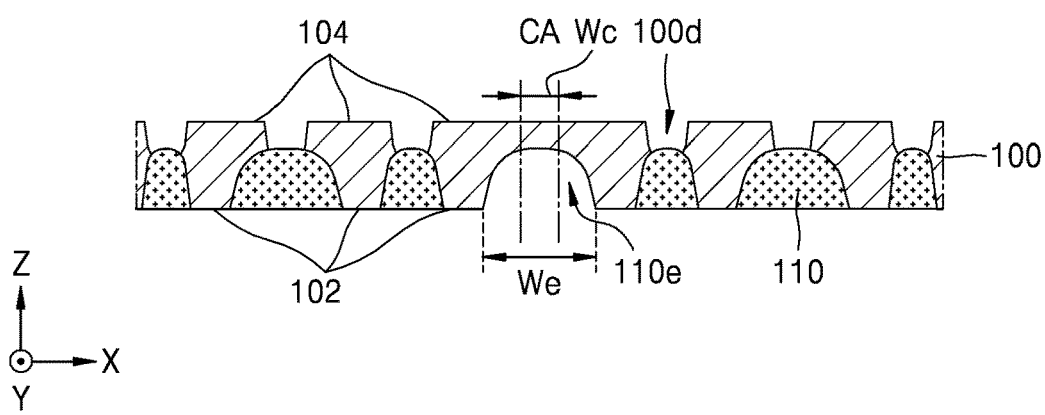

Next, the top surface 100b of the base substrate 100 is etched to form portions 100d exposing the resin 110 filled in the first grooves or trenches 100c as illustrated in FIG. 5. The top surface 100b of the base substrate 100 may be etched in various ways. For example, the top surface 100b of the base substrate 100 may be laminated with photosensitive DFR and then be exposed and developed to expose only portions of the top surface 100b of the base substrate 100 to be etched. Thereafter, portions of the top surface 100b of the base substrate 100 that are not covered with the DFR may be etched using an etching solution such as copper chloride or iron chloride to expose at least portions of the resin 110 on the top surface 100b of the base substrate 100 as illustrated in FIG. 5.

Through the above process, as illustrated in FIG. 5, an interconnection pattern 102 between the portions of the bottom surface 100a of the base substrate 100 filled with the resin 110 and an interconnection pattern 104 between portions of the top surface 100b of the base substrate 100 filled with the resin 110 are obtained. In the semiconductor package substrate 10, the interconnection pattern 104 of the top surface 100b and the interconnection pattern 102 of the bottom surface 100a are electrically connected and thus conductive-layer patterning need be performed on the top surface 100b and the bottom surface 100a as set previously.

At the same time, a second groove or trench 100e is formed in the bottom surface 100a of the base substrate 100. The second groove or trench 100e may be formed not to completely pass through the base substrate 100, similar to the first grooves or trenches 100c. The second groove or trench 100e may be formed to correspond to a cut region CA. For example, the second groove or trench 100e may be formed in one direction (a Y-axis direction) and another direction (an X-axis direction) perpendicular to the direction. The cut region CA and cutting the base substrate 100 will be described in detail with reference to FIG. 8 below.

The second groove or trench 100e may be formed in a portion of the bottom surface 100a of the base substrate 100 at which the first grooves or trenches 100c are not formed, i.e., between adjacent first grooves or trenches 100c. During the manufacture, the second groove or trench 100e is formed after the first grooves or trenches 100c are filled with the resin 110 and thus may be understood as being formed between the first grooves or trenches 100c filled with the resin 110. The second groove or trench 100e may be used as a wettable flank structure facilitating soldering a semiconductor package at a later time.

The second groove or trench 100e may be formed to correspond to the cut region CA. In this case, a width We of the second groove or trench 100e is greater than a width Wc of the cut region CA. When the width We of the second groove or trench 100e is less than the width Wc of the cut region CA, the second groove or trench 100e cannot be used as the wettable flank structure after the semiconductor package substrate 10 is cut and thus it is important to set the width We of the second groove or trench 100e to be greater than the width Wc of the cut region CA.

In the present embodiment, the second groove or trench 100e is formed in the bottom surface 100a of the base substrate 100 simultaneously with the etching of the top surface 100b of the base substrate 100. That is, the top surface 100b and the bottom surface 100a of the base substrate 100 may be simultaneously etched. Accordingly, the second groove or trench 100e may be formed in the bottom surface 100a of the base substrate 100 without performing an additional process, simultaneously with the etching of the portions of the top surface 100b of the base substrate 100. The second groove or trench 100e is formed after the base substrate 100 is filled with the resin 110. A region in which the second groove or trench 100e is formed is locked with the filled resin 110 and thus the second groove or trench 100e having a desired width and depth may be formed.

Figure 6:
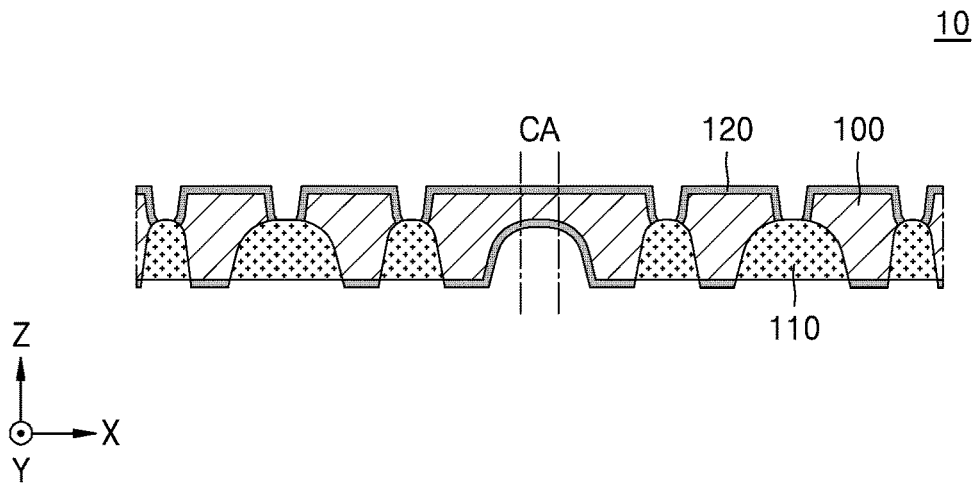

Next, as illustrated in FIG. 6, a plating layer 120 may be formed on at least some of the remaining portions of the base substrate 100. The plating layer 120 may be formed on an inner surface of the second groove or trench 100e, and may be formed on the top surface 100b and the bottom surface 100a of the base substrate 100 and inner surfaces of the first grooves or trenches 100c except the resin 110 in some cases. In particular, the plating layer 120 formed on the inner surface of the second groove or trench 100e may improve solder wettability of the semiconductor package substrate 10. The plating layer 120 may be plated with, for example, Au, Pd, a NiPdAu-Alloy, or the like. An organic film such as an organic solderbility preservative (OSP) may be coated on or anti-tarnishing may be performed on the top surface 100b of the base substrate 100.

In the semiconductor package substrate manufacturing methods according to the above-described embodiments, the insides of the first grooves or trenches 100c may be roughened before the first grooves or trenches 100c of the base substrate 100 are filled with the resin 110. Thus, a degree of adhesion between the resin 110 and the base substrate 100 may be increased dramatically. The insides of the first grooves or trenches 100c of the base substrate 100 may be roughened by a plasma treatment, an ultraviolet treatment, or a hydrogen peroxide/sulfuric acid-based solution. In this case, the insides of the first grooves or trenches 100c of the base substrate 100 may have roughness of 150 nm or more.

As described above, the second groove or trench 100e may be formed to facilitate soldering a semiconductor package during the manufacture of the semiconductor package substrate 10. In a comparative example, a semiconductor package substrate may be soldered by simply soldering right-angled corners thereof or forming grooves at portions to be soldered by a separate process after semiconductor chip packaging. However, solder wettability may significantly decrease when the right-angled corners are simply soldered, and metal burr may occur during the forming of the grooves, thereby decreasing the performance of the semiconductor package.

Accordingly, in a method of manufacturing a semiconductor package substrate according to an embodiment, a wettable flank structure may be efficiently formed by forming the second groove or trench 100e corresponding to the cut region CA after semiconductor chip packaging during the manufacture of the semiconductor package substrate, i.e., during manufacture of lead frames, without performing an additional process.

Although a method of manufacturing a semiconductor package substrate has been described above, the disclosure is not limited thereto. For example, a semiconductor package substrate manufactured using the method of manufacturing a semiconductor package substrate and a method of manufacturing a semiconductor package using the semiconductor package substrate may be understood as falling within the scope of the disclosure.

Figure 7:
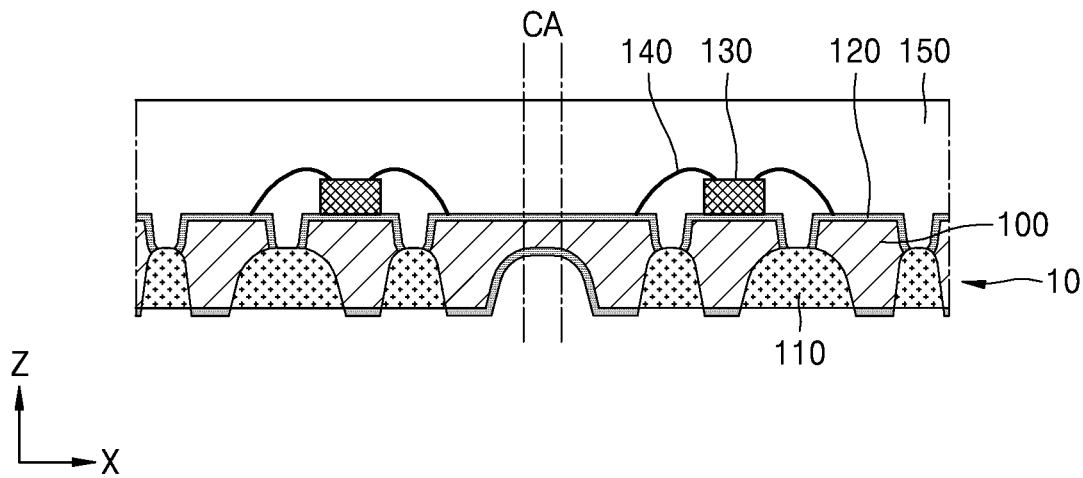
FIGS. 7 and 8 are schematic cross-sectional views illustrating part of a process of manufacturing a semiconductor package according to another embodiment.
Figure 8:
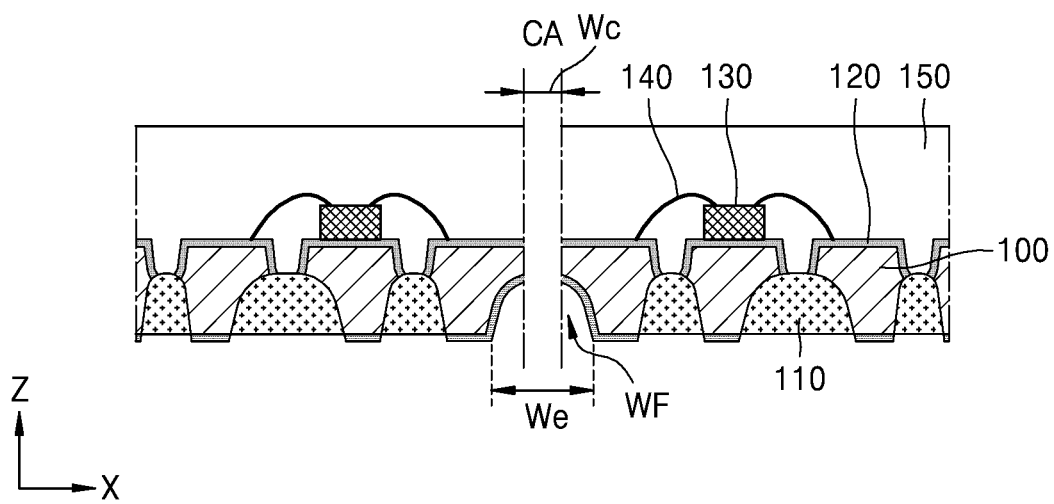
Figure 9:
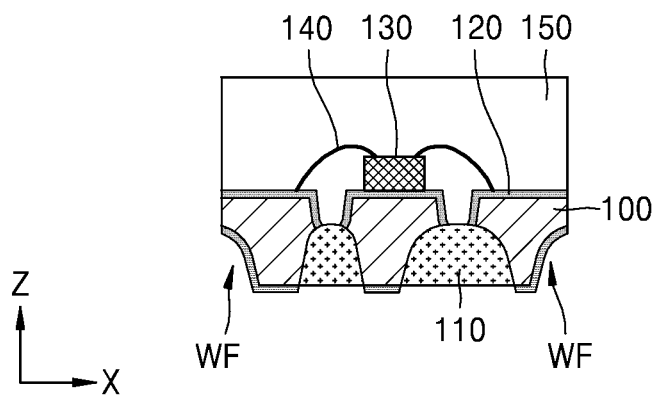
FIG. 9 is a schematic cross-sectional view illustrating a structure of a semiconductor package according to another embodiment.

FIGS. 7 and 8 are schematic cross-sectional views illustrating part of a process of manufacturing a semiconductor package 20 according to another embodiment. FIG. 9 is a schematic cross-sectional view illustrating a structure of the semiconductor package 20 according to another embodiment.

Referring to FIGS. 1 to 6 and 7, a semiconductor chips 130 is mounted on a semiconductor package substrate 10 manufactured by the process described above with reference to FIGS. 1 to 6. The semiconductor chip 130 may be mounted on a flat portion of a top surface 100b of the semiconductor package substrate, and electrically and physically connected to a lead on a base substrate 100 via a wire 140. The wire 140 may be coupled to the semiconductor chip 130 and the lead by wire bonding. One side of the wire 140 is attached to the lead and another side thereof is coupled to the semiconductor chip 130.

A molding layer 150 may be formed on the semiconductor chip 130 on the semiconductor package substrate 10. The molding layer 150 may be configured to seal the semiconductor chip 130 from the outside, and formed in, for example, a single molding structure, a double molding structure, or a molding structure having three or more layers. The molding layer 150 may be formed by curing resin 110 and include, for example, at least one of a fluorescent substance and a light diffusion agent. In some cases, a transparent material that does not contain the fluorescent substance and the light diffusion agent may be used.

After the semiconductor chip 130 is mounted on the semiconductor package substrate 10, the base substrate 100 is cut as illustrated in FIG. 8. The cutting of the base substrate 100 may be understood as cutting the semiconductor package substrate 10 filled with the resin 110. As illustrated in FIG. 8, the base substrate 100 may be cut along a cut region CA formed along the second groove or trench 100e. As described above with reference to FIG. 5, the width We of the second groove or trench 100e may be greater than the width Wc of the cut region CA. Thus, when the base substrate 100 is cut, the semiconductor package substrate 10 has a wettable flank structure WF, a corner of a lower end of which is depressed as illustrated in FIG. 9. Solder wettability of the semiconductor package substrate 10 may be improved due to the wettable flank structure WF.

A method of manufacturing a semiconductor package has been described above but the disclosure is not limited thereto. For example, a semiconductor package manufactured by the method of manufacturing a semiconductor package falls within the scope of the disclosure.

In the related art, a semiconductor package substrate may be soldered by simply soldering right-angled corners thereof or forming grooves at portions to be soldered by a separate process after semiconductor chip packaging. However, solder wettability is greatly decreased when the right-angled corners are soldered, and metal burr occurs during the formation of the grooves by the separate process, thereby decreasing the performance of a semiconductor package.

Generally, a semiconductor package manufacturer receives a completed semiconductor package substrate, i.e., a so-called lead frame, mounts a semiconductor chip thereon, and performs a subsequent process. In this case, the semiconductor package manufacturer may form grooves at portions of a semiconductor package to be soldered during soldering of the semiconductor package after the semiconductor package is manufactured and thus the qualities of the semiconductor package substrate and the semiconductor package may be decreased.

In contrast, in a method of manufacturing a semiconductor package according to an embodiment, the second groove or trench 100e corresponding to the cut region CA is formed without performing an additional process during manufacture of a semiconductor package substrate, i.e., a lead frame, and thus the wettable flank structure WF may be efficiently formed without performing an additional process after semiconductor chip packing. Furthermore, a semiconductor package substrate having the wettable flank structure WF may be provided and thus product competitiveness may be dramatically improved.

According to one or more embodiments as described above, a method of manufacturing a semiconductor package substrate on which soldering is performed in an easy manner and a semiconductor package substrate manufactured using the same, and a method of manufacturing a semiconductor package and a semiconductor package manufactured using the same may be implemented. However, the scope of the disclosure is not limited thereby.

While one or more embodiments have been described with reference to the drawings, it will be understood by those of ordinary skill in the art that various changes in form and details may be made therein and embodiments equivalent thereto may be performed without departing from the spirit and scope of the disclosure as defined by the following claims. Accordingly, the scope of the disclosure should be determined by the technical idea defined in the appended claims.

What is claimed is:

1. A method of manufacturing a semiconductor package substrate, the method comprising:
   forming first grooves or trenches in a bottom surface of a base substrate, the base substrate having a top surface and the bottom surface and formed of a conductive material;
   filling the first grooves or trenches with resin;
   curing the resin;
   removing exposed portions of the resin overfilled in the first grooves or trenches;
   etching the top surface of the base substrate to expose at least portions of the resin filled in the first grooves or trenches; and
   forming a second groove or trench in the bottom surface of the base substrate wherein forming the second groove or trench in the bottom surface of the base substrate is performed after filling the first grooves or trenches with the resin.

2. The method of claim 1, wherein the etching of the top surface of the base substrate and the forming of the second groove or trench are simultaneously performed.

3. The method of claim 1, wherein the forming of the second groove or trench comprises forming the second groove or trench along a cut line.

4. The method of claim 1, wherein the forming of the second groove or trench comprises forming the second groove or trench between adjacent first grooves or trenches filled with the resin.

5. The method of claim 1, further comprising:
   before the filling of the first grooves or trenches with the resin, roughening inner surfaces of the first grooves or trenches.

6. The method of claim 1, wherein an area of the resin exposed on the bottom surface of the base substrate via the first grooves or trenches is greater than that of the resin exposed on the top surface of the base substrate via the etching.

7. The method of claim 1, further comprising forming a plating layer on the base substrate.

8. The method of claim 7, wherein the forming of the plating layer comprises forming the plating layer on an inner surface of the second groove or trench.

9. A semiconductor package substrate manufactured by the method of claim 1.

10. A method of manufacturing a semiconductor package, the method comprising:
    forming first grooves or trenches in a bottom surface of a base substrate, the base substrate having a top surface and the bottom surface and formed of a conductive material;
    filling the first grooves or trenches with resin;
    curing the resin;
    removing exposed portions of the resin overfilled in the first grooves or trenches;
    etching the top surface of the base substrate to expose at least portions of the resin filled in the first grooves or trenches;
    forming a second groove or trench in the bottom surface of the base substrate;
    mounting a semiconductor chip on the base substrate; and
    cutting the base substrate along the second groove or trench, wherein the forming of the second groove or trench comprises forming the second groove or trench along a cut line after filling the first grooves or trenches with the resin.

11. The method of claim 10, wherein the etching of the top surface of the base substrate and the forming of the second groove of trench are simultaneously performed.

12. The method of claim 10, wherein the forming of the second groove or trench comprises forming the second groove or trench between adjacent first grooves or trenches filled with the resin.

13. The method of claim 10, wherein the width of the cut line is less than that of the second groove or trench.

14. The method of claim 10, further comprising forming a plating layer on the base substrate.

15. A semiconductor package manufactured by the method of claim 10.

16. The method of claim 10, wherein an area of the resin exposed on the bottom surface of the base substrate via the first grooves or trenches is greater than that of the resin exposed on the top surface of the base substrate via the etching.

17. The method of claim 10, further comprising:
    before the filling of the first grooves or trenches with the resin, roughening inner surfaces of the first grooves or trenches.

18. The method of claim 14, wherein the forming of the plating layer comprises forming the plating layer on an inner surface of the second groove or trench.

* * * * *